(12) United States Patent
Yamada

(10) Patent No.: US 9,151,780 B2
(45) Date of Patent: Oct. 6, 2015

(54) WAFER INSPECTION INTERFACE AND WAFER INSPECTION APPARATUS

(71) Applicant: Tokyo Electron Limited, Tokyo (JP)

(72) Inventor: Hiroshi Yamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 126 days.

(21) Appl. No.: 13/795,124

(22) Filed: Mar. 12, 2013

(65) Prior Publication Data

US 2013/0249587 A1 Sep. 26, 2013

(30) Foreign Application Priority Data

Mar. 14, 2012 (JP) ................................ 2012-057203

(51) Int. Cl.
*G01R 31/00* (2006.01)
*G01R 1/073* (2006.01)
*G01R 31/28* (2006.01)

(52) U.S. Cl.
CPC ........ *G01R 1/07364* (2013.01); *G01R 31/2891* (2013.01)

(58) Field of Classification Search
CPC ...... G01R 31/28; G01R 1/06; G01R 1/07364; G01R 1/07342; G01R 1/07378; G01R 1/07314; G01R 1/06711; G01R 1/06738; G01R 1/06772; G01R 31/2886; G01R 31/2889; H01L 21/66
USPC ............ 324/755.01, 754, 762, 758, 760, 884, 324/765, 756.03, 754.01, 754.03, 324/754.07–754.11, 754.13, 754.14, 324/757.03, 755.11, 756.01
See application file for complete search history.

(56) References Cited

U.S. PATENT DOCUMENTS

| | | | |
|---|---|---|---|
| 6,249,132 B1 * | 6/2001 | Amemiya ................ | 324/750.08 |
| 2005/0174132 A1 * | 8/2005 | Chang et al. ................ | 324/754 |
| 2005/0275418 A1 * | 12/2005 | Chong et al. ................ | 324/758 |
| 2006/0038575 A1 * | 2/2006 | Takemoto et al. ........... | 324/754 |
| 2007/0090477 A1 * | 4/2007 | Shibayama .................. | 257/431 |
| 2007/0178727 A1 * | 8/2007 | Igarashi et al. ............... | 439/91 |
| 2007/0199583 A1 * | 8/2007 | Choi et al. .................. | 134/94.1 |
| 2009/0085594 A1 * | 4/2009 | Yamamoto et al. .......... | 324/758 |
| 2010/0134127 A1 * | 6/2010 | Breinlinger et al. ......... | 324/757 |

(Continued)

FOREIGN PATENT DOCUMENTS

| | | | |
|---|---|---|---|
| JP | 2004-140241 A | | 5/2001 |
| JP | 2003-142537 A | | 5/2003 |
| KR | 10-2011-0047358 A | | 5/2011 |

OTHER PUBLICATIONS

Translation,2003-142537, May 2003, Japan, Miyatake Toshio.*

*Primary Examiner* — Huy Q Phan
*Assistant Examiner* — Thang Le
(74) *Attorney, Agent, or Firm* — Pearne & Gordon LLP

(57) ABSTRACT

A wafer inspection interface 18 includes a probe card 20 having a substrate 20a and a multiple number of probes 25 that are provided at a surface of the substrate 20a facing a wafer W and arranged to correspond to electrodes of a plurality of semiconductor devices formed on the wafer W; a pogo frame 40 that is in contact with a surface of the probe card 20 opposite to a surface of the probe card 20 facing the wafer W and supports the probe card 20; and a shim 51 provided on the surface of the probe card 20 in contact with the pogo frame 40 and configured to adjust a thickness of the probe card 20. The shim 51 has a cross shape when viewed from the top.

12 Claims, 8 Drawing Sheets

(56) References Cited

U.S. PATENT DOCUMENTS

| | | | |
|---|---|---|---|
| 2011/0043232 A1* | 2/2011 | Takase et al. | 324/755.01 |
| 2011/0181314 A1* | 7/2011 | Hwang et al. | 324/756.03 |
| 2012/0006984 A1* | 1/2012 | Wang et al. | 250/307 |
| 2012/0146679 A1* | 6/2012 | Chang et al. | 324/756.03 |

* cited by examiner

WAFER INSPECTION INTERFACE AND WAFER INSPECTION APPARATUS

CROSS-REFERENCE TO RELATED APPLICATION

This application claims the benefit of Japanese Patent Application No. 2012-057203 filed on Mar. 14, 2012, the entire disclosures of which are incorporated herein by reference.

FIELD OF THE INVENTION

The present disclosure relates to a wafer inspection interface including a probe card and also relates to a wafer inspection apparatus

BACKGROUND OF THE INVENTION

As a wafer inspection apparatus, there is known, for example, a burn-in inspection apparatus or a probe apparatus that inspects electrical characteristics of a multiple number of semiconductor devices formed on a wafer.

FIG. 9 is a cross sectional view illustrating a schematic configuration of a conventional probe apparatus, and FIG. 10 is a cross sectional view illustrating a pogo frame (pogo ring) in the conventional probe apparatus of FIG. 9.

Referring to FIG. 9, a probe apparatus 100 includes a loader chamber 101 serving as a wafer transfer section for transferring a wafer W; and an inspection chamber 102 for performing therein an inspection of electrical characteristics of a multiple number of semiconductor devices formed on the wafer W. This probe apparatus 100 is configured to inspect the electrical characteristics of the semiconductor devices by controlling various types of devices in the loader chamber 101 and the inspection chamber 102 under the control of a controller. The inspection chamber 102 includes a mounting table 106, a pogo frame 109, a probe card 108, and an alignment device 110. The mounting table 106 mounts thereon a wafer W loaded from the loader chamber 101 and is configured to be movable in X, Y, Z and θ directions. The pogo frame 109 is disposed above the mounting table 106, and the probe card 108 is supported on the pogo frame 109. The alignment device 110 is configured to perform alignment (position adjustment) between a multiple number of probes (inspection needles) of the probe card 108 and electrodes of the semiconductor devices formed on the wafer W in cooperation with the mounting table 106. After the wafer W and the probe card 108 are aligned with each other by the alignment device 110 and the mounting table 106 in cooperation, each probe of the probe card 108 is brought into contact with the electrodes of the wafer W, so that electrical characteristics of the multiple number of semiconductor devices formed on the wafer W are inspected for each of the multiple number of semiconductor devices (see, for example, Patent Document 1).

In FIG. 10, the pogo frame 109 is supported by a conversion ring 112 and is fastened to an upper plate of the probe apparatus 100 via the conversion ring 112. The pogo frame 109 includes an opening 109A formed through a central portion of the pogo frame 109 in its thickness direction; and a ring portion 109B surrounding the opening 109A. A multiple number of pogo pins 109C are arranged to penetrate the ring portion 109B in the thickness direction thereof. The pogo pins 109C are in contact with connecting terminals 108A formed on a periphery portion of the probe card 108 disposed under the pogo frame 109. The pogo pins 109C serve to electrically connect probes 108B provided on a central portion of a bottom surface of the probe card 108 with a non-illustrated inspection apparatus. The each probe 108B is brought into contact with corresponding a single electrode of the semiconductor devices, which are placed under the probes 108B, formed on the wafer W.

In the conventional probe apparatus, the probe provided on the probe card is repeatedly brought into contact with each of the multiple number of semiconductor devices formed on the wafer and the electrical characteristics of the semiconductor devices are repeatedly inspected for each of them. Therefore, a contact surface of the probe card in contact with the wafer has a small area, and, thus, smoothness on this contact surface has not been a problem.

Patent Document 1: Japanese Patent Laid-open Publication No. 2004-140241

However, a wafer inspection apparatus in accordance with the present disclosure is a whole contact type apparatus allowing all the probes formed on the probe card to be brought into contact with all the electrodes of the semiconductor devices formed on the wafer at one time. For this reason, a contact surface of the probe card in contact with the multiple number of semiconductor devices formed on the wafer becomes wider as compared with a conventional apparatus. As a result, it is difficult to maintain smoothness of the contact surface of the probe card in contact with the wafer.

BRIEF SUMMARY OF THE INVENTION

In view of the foregoing, illustrative embodiments provide a wafer inspection interface and a wafer inspection apparatus capable of maintaining smoothness of a surface of a probe card facing a wafer, of which a multiple number of probes are respectively brought into contact with a multiple number of electrodes of a multiple number of semiconductor devices formed on a wafer at one time, within a certain range.

In accordance with one aspect of an illustrative embodiment, there is provided a wafer inspection interface.

The wafer inspection interface includes a probe card including a substrate and a multiple number of probes that are provided at a surface of the substrate facing a wafer and arranged to correspond to electrodes of a multiple number of semiconductor devices formed on the wafer; a frame that is in contact with a surface of the probe card opposite to a surface of the probe card facing the wafer and supports the probe card; and a spacer provided on the surface of the probe card in contact with the frame and configured to adjust a thickness of the probe card.

The spacer may be configured to improve smoothness of the surface of the probe card facing the wafer.

The surface of the probe card facing the wafer may be a surface formed by front ends of the multiple number of probes.

The probes of the probe card may be divided into a multiple number of probe groups corresponding to multiple semiconductor devices formed on the wafer, and the spacer may be provided at a gap between the probe groups.

The probe groups may be arranged in a grid shape, and the spacer may be provided at an edge of the gap between the probe groups.

The spacer may have a cross shape when viewed from the top.

The spacer may be made of a material having a low thermal expansion coefficient equal to or similar to that of the substrate of the probe card.

The smoothness may have an arithmetical mean roughness Ra ≤ about 30 μm.

In accordance with another aspect of the illustrative embodiment, there is provided a wafer inspection apparatus having an inspection chamber for inspecting electrical characteristics of semiconductor devices formed on a wafer; and a transfer device for loading and unloading the wafer into and from the inspection chamber. The wafer inspection apparatus includes a wafer inspection interface having a probe card including a substrate and a multiple number of probes that are provided at a surface of the substrate facing a wafer and arranged to correspond to electrodes of a multiple number of semiconductor devices formed on the wafer; a frame that is in contact with a surface of the probe card opposite to a surface of the probe card facing the wafer and supports the probe card; and a spacer provided on the surface of the probe card in contact with the frame and configured to adjust a thickness of the probe card.

In accordance with illustrative embodiments, a spacer configured to adjust a thickness of a probe card is provided on a surface of the probe card in contact with a frame. Thus, it is possible to maintain smoothness of a surface of the probe card facing the wafer, of which a multiple number of probes are respectively brought into contact with a multiple number of electrodes of a multiple number of semiconductor devices formed on a wafer at one time, within a certain range.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 4A is a plane view showing a contact surface of the probe card in contact with a pogo frame and FIG. 4B is a plane view showing a contact surface of the probe card in contact with a wafer;

DETAILED DESCRIPTION OF THE INVENTION

Hereinafter, illustrative embodiments will be described in detail with reference to the accompanying drawings.

Figure 1:
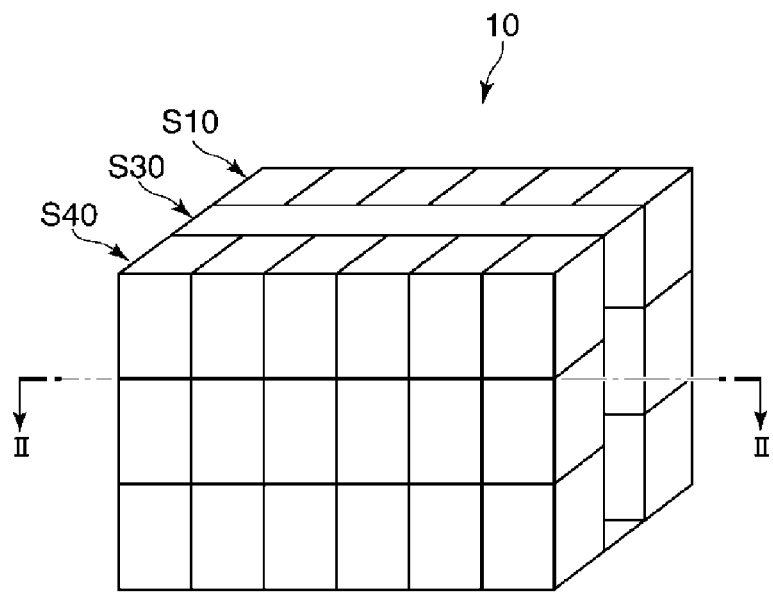
FIG. 1 is a perspective view illustrating an exterior view of a wafer inspection apparatus in accordance with an illustrative embodiment.

FIG. 1 is a perspective view illustrating an exterior view of a wafer inspection apparatus in accordance with an illustrative embodiment.

The wafer inspection apparatus 10 is configured as a whole contact type inspection apparatus that inspects electrical characteristics by bringing all probes of a probe card into contact with all electrodes of semiconductor devices formed on a wafer at one time. This wafer inspection apparatus 10 is developed based on the technical concept of sharing many devices. Accordingly, in order to reduce a size of the apparatus, a wafer is aligned at a place other than an inspection chamber.

In FIG. 1, the wafer inspection apparatus 10 includes a loading/unloading section S10, provided at a rear side of the wafer inspection apparatus 10, for loading and unloading a wafer; an inspection section S40 provided at a front side of the wafer inspection apparatus 10 while facing the loading/unloading section S10; and a transfer section S30 provided between the loading/unloading section S10 and the inspection section S40.

The loading/unloading section S10 is partitioned into a multiple number of unit loading/unloading areas corresponding to a multiple number of mounting devices. The inspection section S40 is also partitioned into a multiple number of unit inspection areas corresponding to a multiple number of inspection chambers. That is, each of the loading/unloading section S10 and the inspection section S40 is partitioned into the multiple number of chambers in a 3-dimensional grid shape. A wafer transfer device to be described later (see FIG. 2) is moved in the transfer section S30 between the loading/unloading section S10 and the inspection section S40 and transfers wafers.

Figure 2:
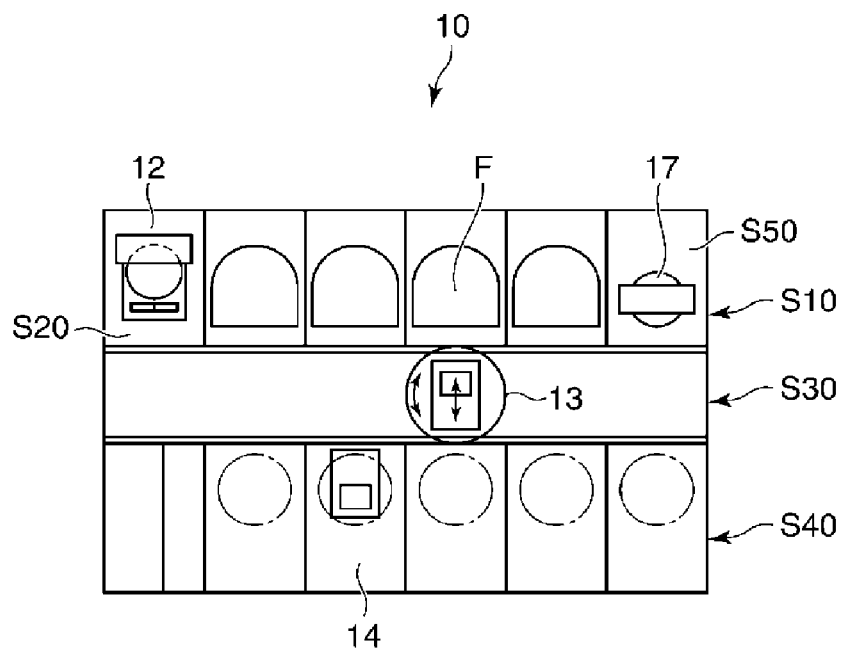
FIG. 2 is a cross sectional view taken along a line II-II of FIG. 1.

FIG. 2 is a cross sectional view taken along a line II-II of FIG. 1.

Referring to FIG. 2, a multiple number of accommodation devices for accommodating therein FOUPs F is provided in the loading/unloading section S10 as example mounting devices. An alignment section S20 including an alignment chamber 12 is provided at a left end of the loading/unloading section S10. A needle mark inspection section S50 including a needle mark inspection apparatus 17 is provided at a right end of the loading/unloading section S10. Further, a wafer transfer device 13 is provided in the transfer section S30, and a multiple number of inspection chambers 14 are arranged in the inspection section S40.

The wafer transfer device 13 includes, for example, a rotational body provided on a base; two vertically arranged arms, i.e., an upper arm and a lower arm, configured to be individually moved back and forth on the rotational body in one direction; an elevation device configured to move the base and the arms up and down; and a moving device configured to move these devices back and forth along the transfer section S30. A pick 13B for mounting and carrying a wafer W thereon is provided at a leading end of the upper arm 13A (see FIG. 3 to be described below).

In the wafer inspection apparatus 10, the wafer transfer device 13 receives an uninspected wafer W and transfers the uninspected wafer W into the alignment chamber 12 from a FOUP F. In the alignment chamber 12, alignment of the wafer W with the pick 13B of the wafer transfer device is performed. Then, the wafer transfer device 13 transfers the aligned wafer W into an inspection chamber 14. The inspection chamber 14 includes a wafer inspection interface 18 to be described later. The wafer inspection interface 18 is configured to inspect electrical characteristics of semiconductor devices formed on the wafer W.

Further, the wafer transfer device 13 transfers the inspected wafer W from the inspection chamber 14 to the needle mark inspection device 17 disposed in the needle mark inspection section S50 located at one end of the loading/unloading section S10. The needle mark inspection device 17 is configured to inspect a needle mark (i.e., a mark of a contact with a probe 25) on an electrode of the respective semiconductor devices on the inspected wafer W. Then, the wafer transfer device 13 loads the inspected wafer W into the FOUP F within the loading/unloading section S10.

Here, the wafer transfer device 13, for example, transfers a first wafer W unloaded from a first FOUP F into a first inspection chamber 14. While inspecting the electrical characteristics of semiconductor devices formed on the first wafer W in the first inspection chamber 14, the wafer transfer device 13 may transfer a second wafer W unloaded from a second FOUP F into a second inspection chamber 14. Alternatively, while inspecting the electrical characteristics of the semiconductor devices formed on the first wafer W in the first inspection chamber 14, the wafer transfer device 13 may unload an inspected third wafer W from a third inspection chamber and load the inspected third wafer W into a third FOUP F. That is, the wafer transfer device 13 transfers the wafers W in sequence between the multiple number of FOUPs F and the multiple number of inspection chambers 14, and electrical characteristics of semiconductor devices formed on the wafers W are inspected in sequence in the respective inspection chambers 14.

Figure 3:
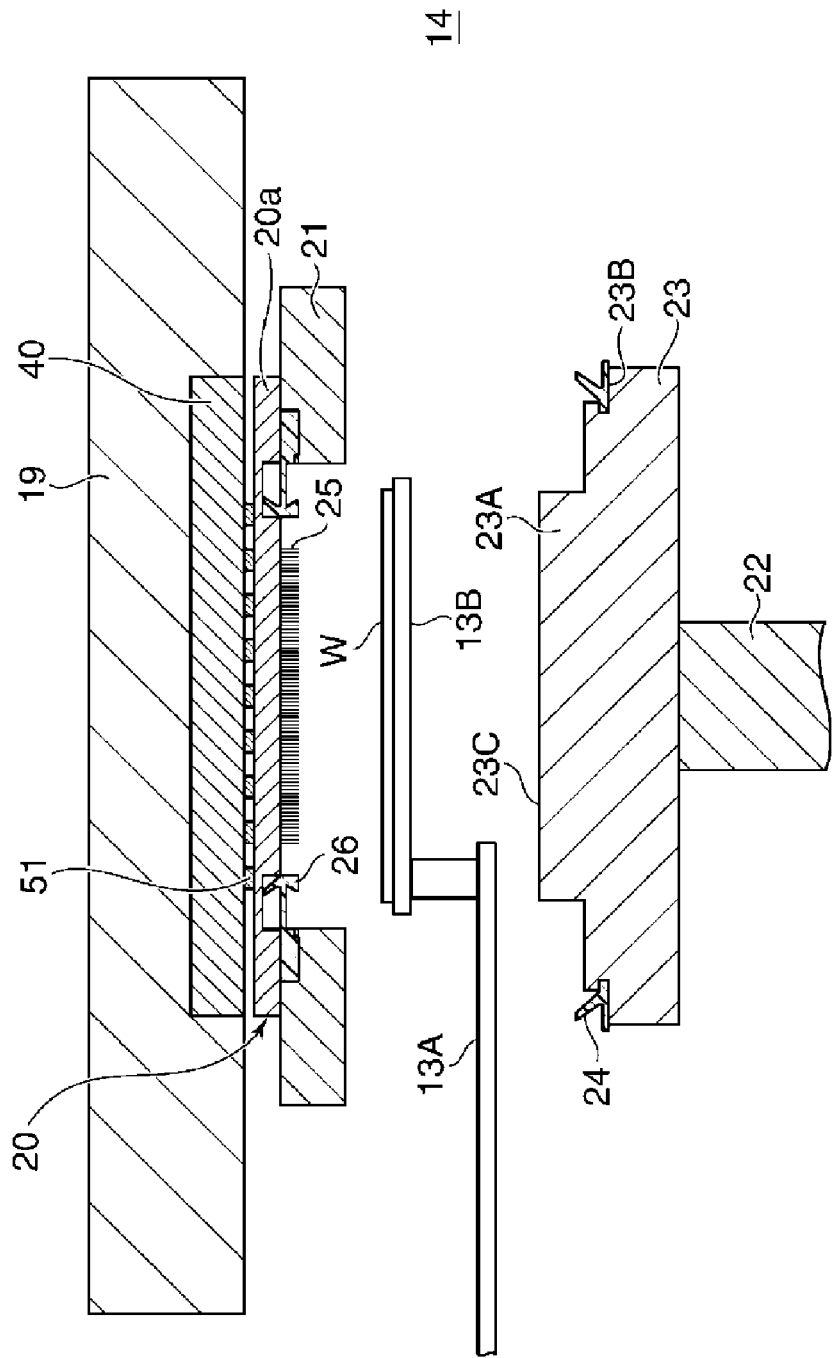
FIG. 3 is a cross sectional view schematically illustrating a configuration of a wafer inspection interface included in an inspection chamber of FIG. 2.

FIG. 3 is a cross sectional view schematically illustrating a configuration of a wafer inspection interface included in the inspection chamber of FIG. 2.

Referring to FIG. 3, the wafer inspection interface 18 includes a head plate 19, a frame (hereinafter, referred to as a "pogo frame") 40, a probe card 20. The head plate is provided at a ceiling portion of the inspection chamber 14 and is made of a plate-shaped member. The pogo frame 40 forms a bottom surface of the head plate 19. The probe card 20 is disposed to be in contact with a bottom surface of the pogo frame 40. The probe card 20 includes a substrate 20*a* and a multiple number of probes 25 provided at a surface of the substrate 20*a* facing the wafer W. On a surface of the probe card 20 in contact with the pogo frame 40, a multiple number of spacers (hereinafter, referred to as "shim") 51 configured to adjust a thickness of the probe card 20 are provided. The wafer inspection interface 18 further includes a fixing ring 21, a rod-shaped lifter 22 and a table-shaped chuck top 23. The fixing ring 21 holds the periphery of the probe card 20 and supports the probe card 20 to the pogo frame 40. The lifter 22 stands uprightly from a bottom portion of the inspection chamber 14 and is configured to be moved up and down. The chuck top 23 is provided on a top portion of the lifter 22. The chuck top 23 has a cross section in which a central portion of the chuck top 23 is protruded. Further the chuck top 23 includes an upwardly protruding portion 23A; and a step-shaped portion 23B surrounding the protruding portion 23A and formed to be lower than the protruding portion 23A. A top flat surface of the protruding portion 23A serves as a wafer mounting surface 23C on which the wafer W is mounted.

Figure 4A:
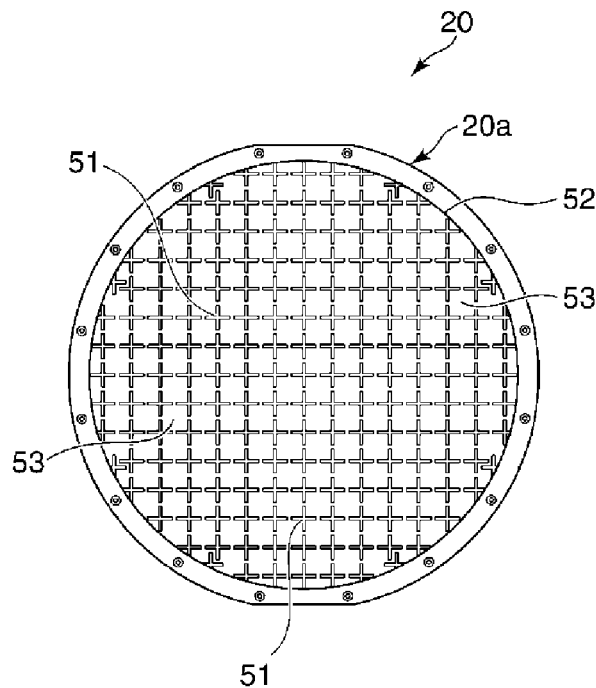
FIGS. 4A and 4B illustrate a probe card of FIG. 3, and specifically.
Figure 4B:
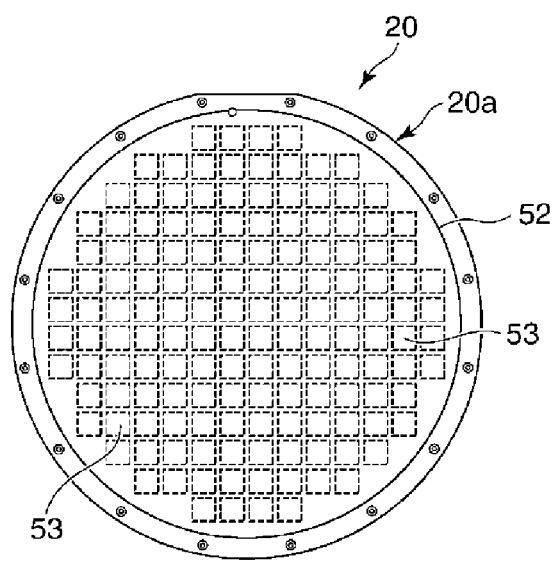

FIGS. 4A and 4B illustrate the probe card 20 of FIG. 3, and specifically, FIG. 4A is a plane view showing a contact surface of the probe card 20 in contact with the pogo frame 40 and FIG. 4B is a plane view showing a contact surface of the probe card 20 in contact with the wafer W.

In FIGS. 4A and 4B, the probe card 20 is a circular plate made of, for example, ceramic and having a diameter of about 330 mmϕ and a thickness of about 2.9 mm. At a central contact area 52, a multiple number of square-shaped probe areas 53 having sides of, for example, about 10 mm in length are arranged regularly. At each probe area 53, a group of the probes 25 respectively corresponding to a multiple number of electrodes of each of semiconductor devices formed on the wafer W is provided. The group of the probes 25 forms a single probe group corresponding to the multiple number of electrodes of each semiconductor device.

In FIG. 4A, there are grid-patterned gaps between the probe areas 53 regularly arranged at the contact area 52. At an edge of each of the grid-patterned gaps, a cross-shaped shim 51 is provided when viewed from the top.

Figure 5:
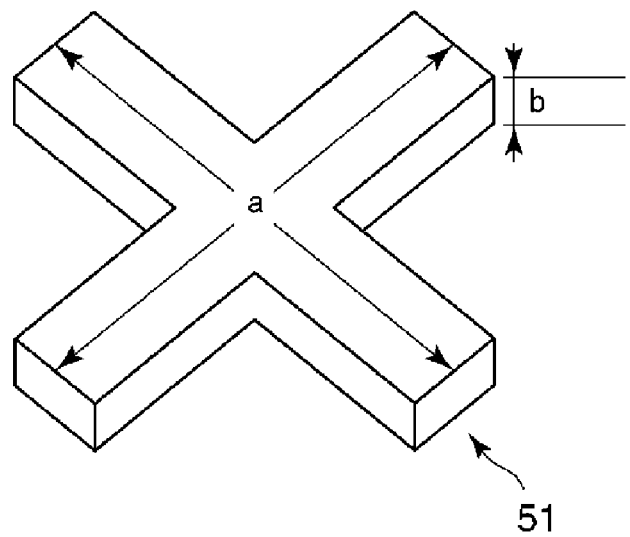
FIG. 5 is a perspective view of a shim of FIGS. 4A and 4B.

FIG. 5 is a perspective view of a shim 51 of FIGS. 4A and 4B.

In FIG. 5, the shim 51 has a cross shape when viewed from the top. The shim 51 has a length a in a range of, for example, from about 15 mm to about 20 mm and a thickness b in a range of, for example, from about 150 μm to about 250 μm. The shim 51 is made of a material, such as Invar, having a low thermal expansion coefficient equal to or similar to that of the substrate 20*a* of the probe card 20. Thus, even if thermal expansion or thermal contraction occurs, there is no deformation between the substrate 20*a* and the shim 51. When two members have similar thermal expansion coefficient, for example, even if an ambient temperature is changed according to a change in a inspection temperature where the electrical characteristics of semiconductor devices formed on the wafer W are inspected, a difference in thermal expansion coefficient between the two members is small enough not to be deformed at a contact surface between the two members.

Herein, surface smoothness of the substrate 20*a* of the probe card 20 can be expressed as an arithmetical mean roughness Ra in a range of, for example, from about 50 μm to about 100 μm. Therefore, if the substrate 20*a* is brought into contact with the pogo frame 40 having high surface smoothness, a contact surface of the substrate 20*a* in contact with the pogo frame 40 becomes smooth but the other surface opposite to the contact surface of the substrate 20*a* in contact with the pogo frame 40 does not become smooth. Further, when forming the probe card 20 by providing the multiple number of probes 25 at the surface of the substrate 20*a* facing the wafer W, a thickness of the probe card 20, i.e., a length from the contact surface of the substrate 20*a* in contact with the pogo frame 40 to a front end of the probe 25, is not uniform due to nonuniformity in length of the probes 25 along with nonuniformity in thickness of the substrate 20*a*.

However, a probe apparatus in accordance with illustrative embodiments needs to have an arithmetical mean roughness Ra of, for example, ≤ about 30 μm as the smoothness of the surface of the probe card 20 facing the wafer W.

Therefore, in order to obtain the required smoothness of the surface of the probe card 20 facing the wafer W, the present inventors provides the cross-shaped shim 51 shown in FIG. 5 at each edge of the grid-patterned gaps between the probe areas 53 regularly arranged in the probe card 20. Thus, the thickness of the probe card 20 becomes uniform and smoothness required for the surface of the probed card 20 facing the wafer W can be obtained.

Further, the surface of the probe card 20 facing the wafer W is defined as a surface formed by front ends of the multiple number of probes 25.

The shim 51 is attached to the probe card 20 as follows.

Above all, a thickness of the probe card 20 is measured at each edge (hereinafter, referred to as "shim attaching position") of the grid-patterned gaps between the probe areas 53 regularly arranged in the probe card 20. Then, a multiple number of shims 51 having a variance in thickness by, for example, about 10 μm, are prepared. It is determined which shim is attached to the shim attaching position in order to uniformize the thickness of the probe card 20. The shim 51 having a certain thickness determined as above is attached to corresponding shim attaching position. As a result, the thickness of the probe card 20 becomes uniform and the arithmetical mean roughness Ra about 30 μm) of the surface of the probe card 20 facing the wafer W can be obtained. The shim 51 may be attached to the probe card 20 with, for example, a thermosetting adhesive.

Figure 6:
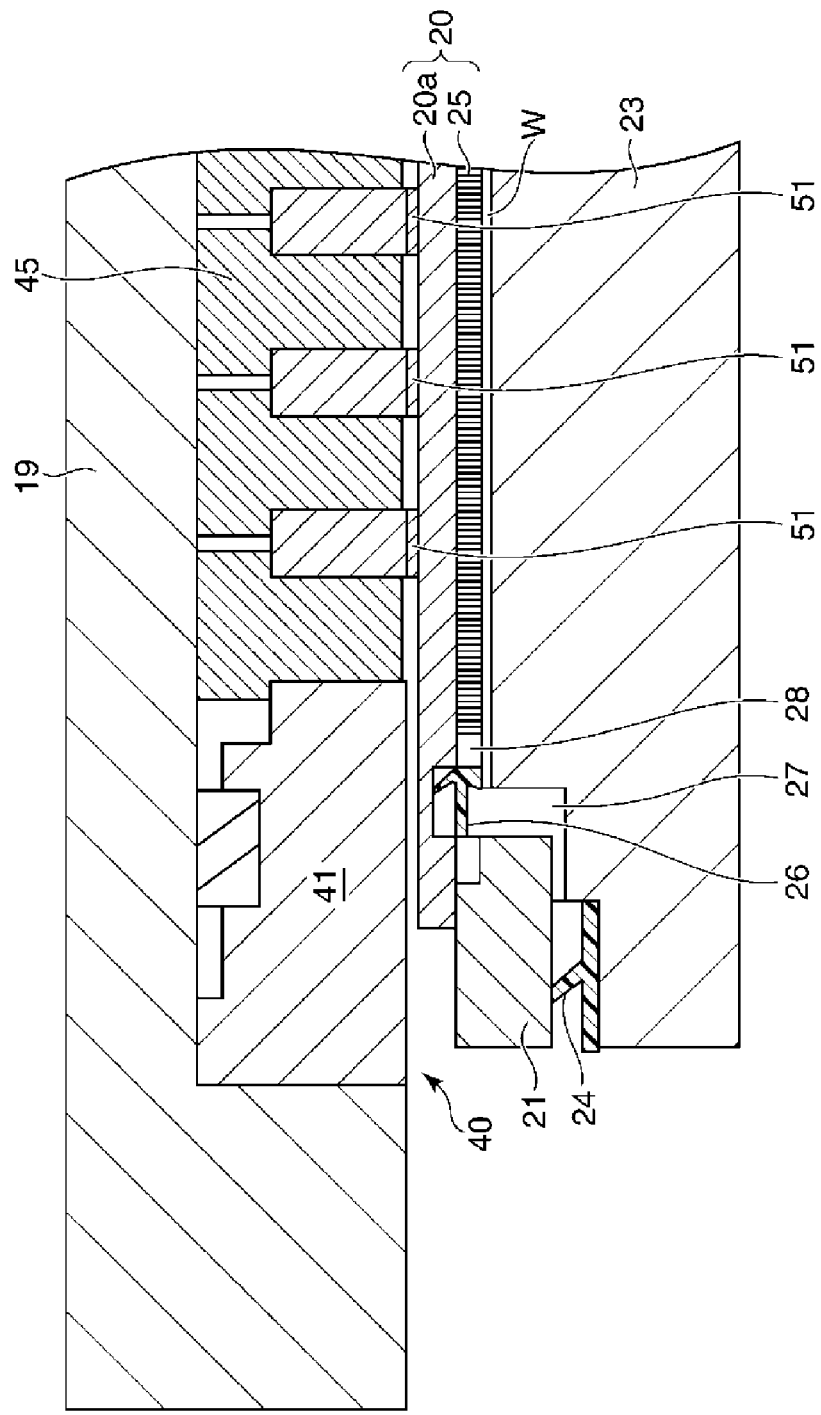
FIG. 6 is a partially enlarged cross sectional view of the wafer inspection interface shown in FIG. 3.
Figure 7A:
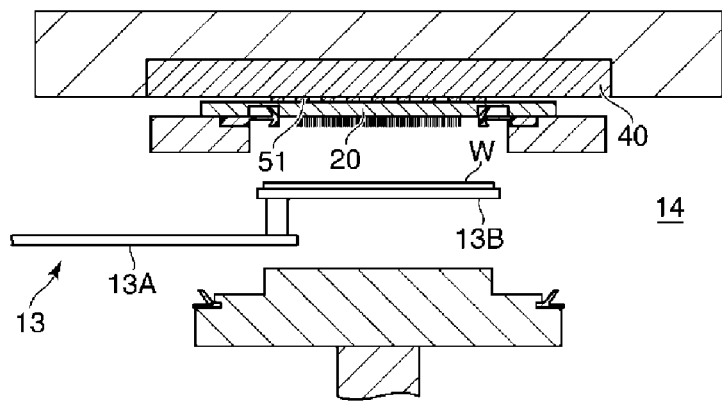
FIGS. 7A to 7C are process diagrams for inspecting electrical characteristics of each semiconductor device on a wafer by using the wafer inspection interface of FIG. 6.
Figure 7B:
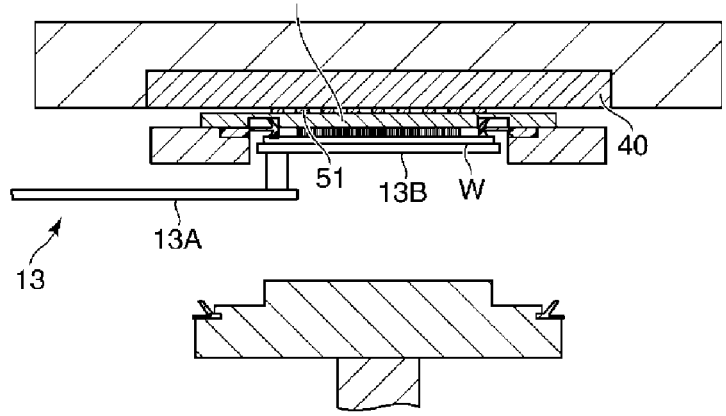
Figure 7C:
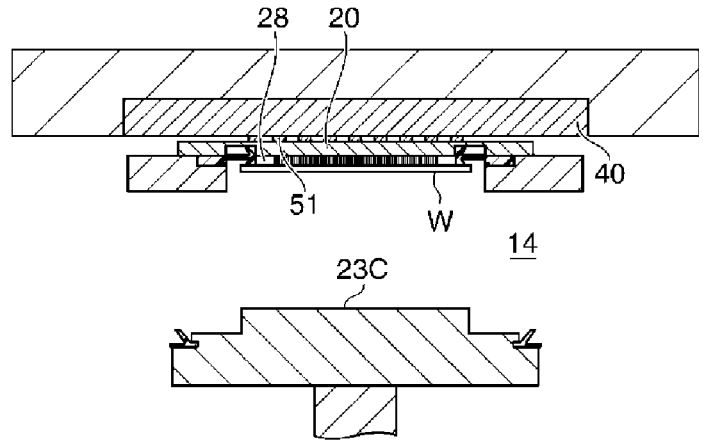

FIG. 6 is a partially enlarged cross sectional view of the wafer inspection interface of FIG. 3.

In FIG. 6, the shims 51 each having a certain thickness are attached to the contact surface of the probe card 20 in contact with the pogo frame 40. That is, the wafer inspection interface 18 includes the probe card 20; the table-shaped chuck top 23 disposed to face the probe card 20 with the wafer W therebetween; and the pogo frame 40 in contact with the surface of the probe card 20 opposite to the surface facing the wafer W and supporting the probe card 20. The probe card includes a substrate 20a and probes 25 provided at a surface of the substrate 20a facing the wafer W.

Each shim 51 is attached to the shim attaching position on the contact surface of the probe card 20 in contact with the pogo frame 40. Thus, nonuniformity in thickness of the probe card 20 can be prevented and smoothness of the surface of the probe card 20 facing the wafer W can be maintained within a certain range.

The fixing ring 21 configured to surround the contact area 52 of the probe card 20 fixes the probe card 20 to the pogo frame 40. Further, an inner space 28 is formed between the probe card 20 and the wafer W, and an outer space 27 surrounding the inner space 28 is formed between the chuck top 23 and the fixing ring 21. The inner space 28 and the outer space 27 are sealed by seal members 26 and 24, respectively (see FIG. 3).

Now, a process of inspecting electrical characteristics of semiconductor devices on a wafer by using the wafer inspection apparatus having the wafer inspection interface configured as described above will be explained.

FIGS. 7A to 8B are process diagrams for inspecting electrical characteristics of semiconductor devices on a wafer using the wafer inspection apparatus of FIG. 6.

Above all, the aligned wafer W is loaded into the inspection chamber 14 by the wafer transfer device 13. Then, the wafer W aligned with the pick 13B is positioned to face the probe card 20. At this time, the wafer transfer device 13 aligns the pick 13B with the probe card 20 by moving the arm 13A of the wafer transfer device 13 slightly (see FIG. 7A). Accordingly, the wafer W and the probe card 20 are aligned with each other.

Thereafter, the wafer transfer device 13 brings the wafer W into contact with the probe card 20 by moving the pick 13B toward the probe card 20. At this time, since the wafer W and the probe card 20 have been already aligned with each other, each probe 25 of the probe card 20 is accurately brought into contact with each of the electrodes of the semiconductor devices formed on the wafer W (see FIG. 7B). At this time, the multiple number of shims 51 are provided on the contact surface of the probe card 20 in contact with the pogo frame 40 and the thickness of the probe card 20 is adjusted to be uniform. Accordingly, the smoothness of the surface of the probe card 20 facing the wafer W is maintained within a certain range, for example, Ra (the arithmetical mean roughness)≤ about 30 μm. Therefore, each probe 25 of the probe card 20 is accurately brought into contact with each of the electrodes of the semiconductor devices formed on the wafer W.

Then, by depressurizing the inner space 28 between the probe card 20 and the wafer W, the wafer W is attracted toward and temporarily held by the probe card 20. Thereafter, the pick 13B is separated from the wafer W and is retreated out of the inspection chamber 14 by the wafer transfer device 13 (see FIG. 7C).

Figure 8A:
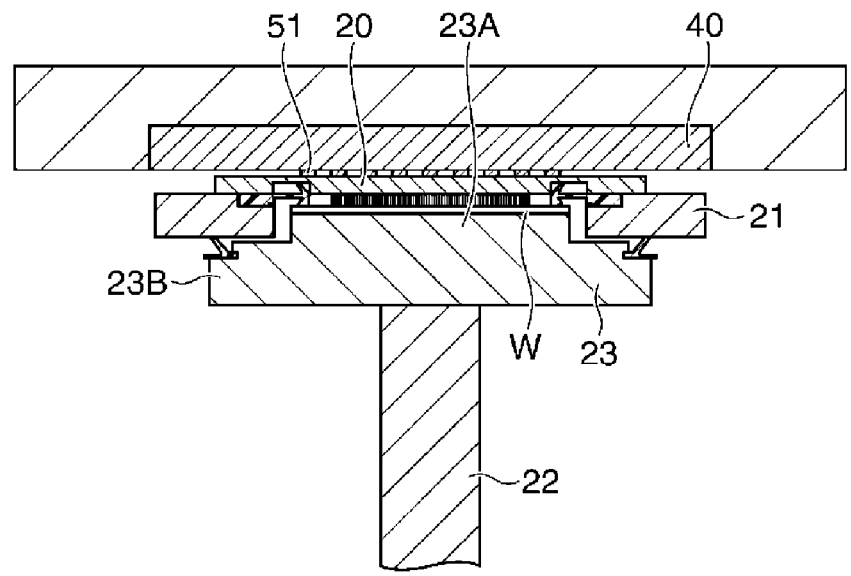
FIGS. 8A and 8B are process diagrams for inspecting electrical characteristics of each semiconductor device on a wafer by using the wafer inspection interface of FIG. 6.

Subsequently, the lifter 22 for supporting the chuck top 23 moves the chuck top 23 upward and brings the chuck top 23 into contact with the fixing ring 21. At this time, since the protruding portion 23A of the chuck top 23 protrudes upward from the step-shaped portion 23B, the wafer mounting surface 23C, i.e., the top flat surface of the protruding portion 23A, comes into contact with the wafer W temporarily held by the probe card 20. As a result, the wafer W is mounted on the wafer mounting surface 23C (FIG. 8A).

Figure 8B:
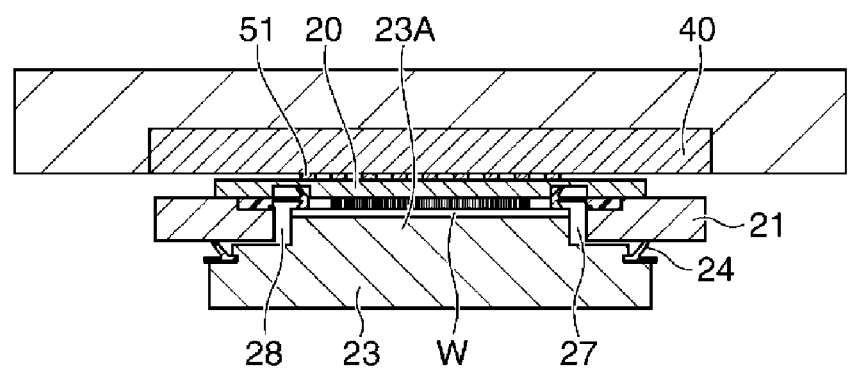
Figure 8B:
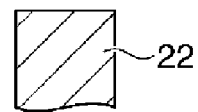
Figure 9:
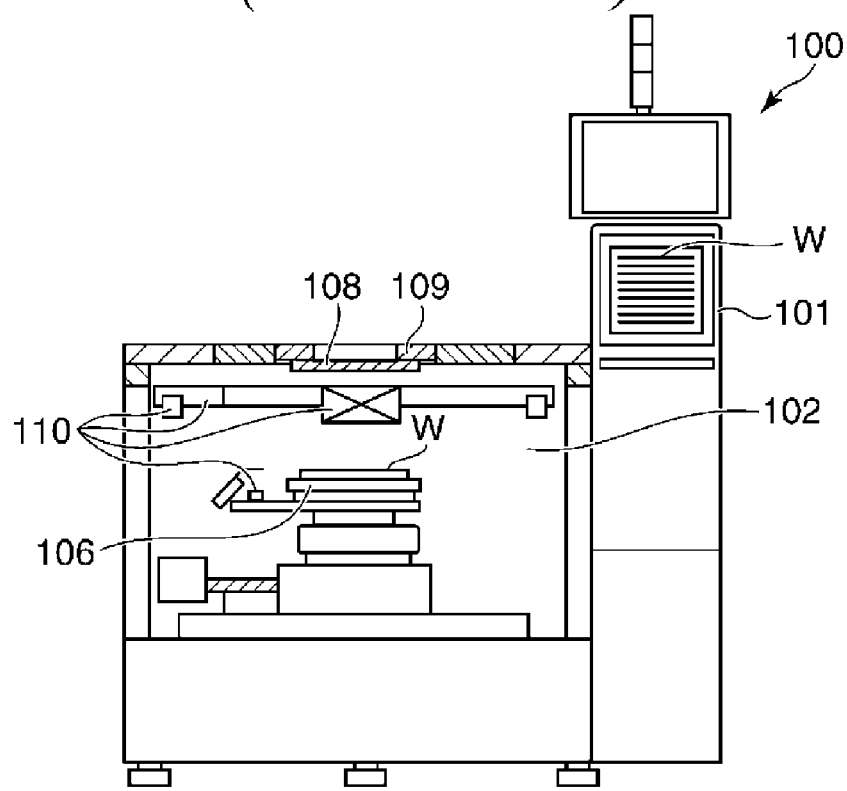
FIG. 9 is a cross sectional view illustrating a schematic configuration of a conventional probe apparatus.
Figure 10:
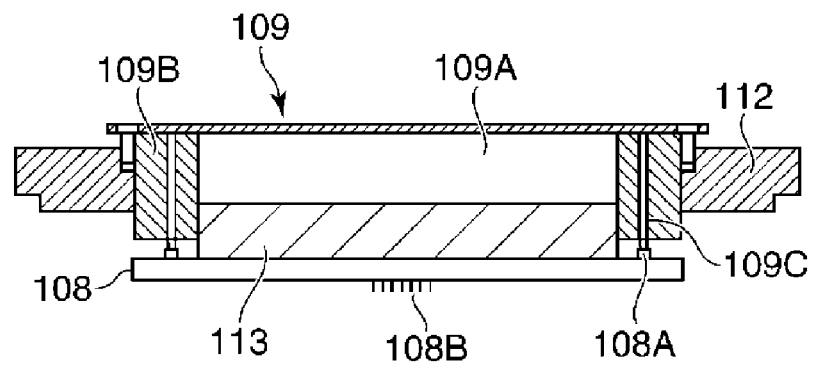
FIG. 10 is a cross sectional view illustrating a pogo frame in FIG. 9.

Then, the chuck top 23 is brought into contact with the fixing ring 21, and the outer space 27 formed between the chuck top 23 and the fixing ring 21 is depressurized. Accordingly, the chuck top 23 is attracted toward the fixing ring 21 and indirectly fixed by the fixing ring 21. At this time, the chuck top 23 attracted to the fixing ring 21 presses the wafer W located on the wafer mounting surface 23C toward the probe card 20. Since, however, the chuck top 23 has higher stiffness than that of the wafer W, the wafer W can be uniformly pressed toward the probe card 20. Thereafter, the lifter 22 is moved downward and separated from the chuck top 23 (FIG. 8B).

Subsequently, an electric current of a preset value flows to the electrodes of the semiconductor devices from each of the probes 25 of the probe card 20, and electrical characteristics of the semiconductor devices are inspected at one time. Then, the inspection process is finished.

In accordance with the present illustrative embodiment, the shim 51 configured to adjust a thickness of the probe card 20 is provided on the contact surface of the probe card 20 in contact with the pogo frame 40. Thus, a thickness of the probe card, of which a multiple number of probes are respectively brought into contact with a multiple number of electrodes of semiconductor devices formed on the wafer W at one time, becomes uniform and smoothness of a surface of a probe card facing the wafer W can be improved. Further, each probe 25 provided at the probe card 20 can be accurately brought into contact with each of the electrodes of the semiconductor devices formed on the wafer W. Thus, it is possible to inspect the electrical characteristics of the semiconductor devices formed on the wafer W appropriately.

In accordance with the present illustrative embodiment, the shim 51 has a cross shape when viewed from the top. Thus, it is easy to fit the shim 51 to a shape of each edge, i.e., shim attaching position, of the grid-patterned gaps between the probe groups provided in the probe card 20. Further, the shim 51 is configured to be easily gripped with, for example, a hand of an operator or a jig. Thus, it is easy to handle the shim 51 when the shim 51 is attached to the substrate 20a of the probe card 20 so that working efficiency can be improved. Furthermore, the shim 51 can be easily attached to any place serving as the shim attaching position of the probe card 20. Thus, it is easy to adjust the thickness and it is easy to maintain smoothness of the surface of the probe card facing the wafer W. Moreover, the shim 51 has a certain plane area as compared with, for example, a shim having a circular cross section. Thus, it is possible to prevent a local stress concentration and to suppress local deformation of the probe card 20. Accordingly, it is possible to prevent local inclination of the probe 25 provided on the substrate 20a.

In the present illustrative embodiment, it is desirable that a shim provided around a periphery of the contact area 52 of the probe card 20 has a L-shape when viewed from the top. Thus, the shim can be attached uniformly over an entire surface of the contact area 52, and smoothness of the surface of the probe card 20 facing the wafer W can be easily improved. Further, in the present illustrative embodiment, the shim 51 may have a cylinder shape or a prism shape instead of the cross shape when viewed from the top.

In accordance with the present illustrative embodiment, the electrical characteristics of the semiconductor devices on the wafer W are inspected by contacting each of the probes 25 of the probe card 20 with each of the electrodes of all semiconductor devices on the wafer W at one time. Accordingly, productivity of the semiconductor devices can be improved.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

What is claimed is:

1. A wafer inspection interface comprising:
   a probe card including a substrate and a multiple number of probes that are provided at a surface of the substrate facing a wafer and arranged to correspond to electrodes of a plurality of semiconductor devices formed on the wafer;
   a frame that is in contact with a surface of the probe card opposite to a surface of the probe card facing the wafer and supports the probe card; and
   a plurality of spacers provided on the surface of the probe card in contact with the frame and configured to adjust a thickness of the probe card,
   wherein the probes of the probe card are divided into a plurality of probe groups corresponding to multiple semiconductor devices formed on the wafer,
   the plurality of spacers are provided at gaps between the probe groups, and
   a thickness of each spacer is individually set based on a thickness of the probe card measured at a corresponding spacer attaching position, so that a total thickness, including the thickness of the probe card and the thickness of each spacer, is uniform at each spacer attaching position.

2. The wafer inspection interface of claim 1,
   wherein each spacer is configured to improve smoothness of the surface of the probe card facing the wafer.

3. The wafer inspection interface of claim 2,
   wherein the surface of the probe card facing the wafer is a surface formed by front ends of the multiple number of probes.

4. The wafer inspection interface of claim 1,
   wherein the probe groups are arranged in a grid shape, and each spacer is provided at an edge of the gap between the probe groups.

5. The wafer inspection interface of claim 4,
   wherein each spacer has a cross shape when viewed from the top.

6. The wafer inspection interface of claim 1,
   wherein each spacer is made of a material having a low thermal expansion coefficient equal to or similar to that of the substrate of the probe card.

7. The wafer inspection interface of claim 2,
   wherein the smoothness has an arithmetical mean roughness Ra≤about 30 μm.

8. The wafer inspection interface of claim 6,
   wherein each spacer is configured to improve smoothness of the surface of the probe card facing the wafer.

9. The wafer inspection interface of claim 8,
   wherein the surface of the probe card facing the wafer is a surface formed by front ends of the multiple number of probes.

10. The wafer inspection interface of claim 6,
    wherein the probe groups are arranged in a grid shape, and each spacer is provided at an edge of the gap between the probe groups.

11. The wafer inspection interface of claim 10,
    wherein each spacer has a cross shape when viewed from the top.

12. The wafer inspection interface of claim 8,
    wherein the smoothness has an arithmetical mean roughness Ra≤about 30 μm.

* * * * *